(12) United States Patent
Takesako et al.

(10) Patent No.: US 8,026,164 B2
(45) Date of Patent: Sep. 27, 2011

(54) SEMICONDUCTOR DEVICE AND METHOD OF MANUFACTURING THE SAME

(75) Inventors: Satoshi Takesako, Tokyo (JP); Shinichi Akiyama, Tokyo (JP); Tamotsu Owada, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/603,207

(22) Filed: Oct. 21, 2009

(65) Prior Publication Data

US 2010/0164119 A1 Jul. 1, 2010

(30) Foreign Application Priority Data

Dec. 26, 2008 (JP) ................... 2008-332602

(51) Int. Cl.
*H01L 21/4763* (2006.01)
(52) U.S. Cl. ......... 438/618; 438/623; 438/622; 438/633
(58) Field of Classification Search .................. 438/618, 438/597, 637, 629, 639, 640, 667, 668, 623, 438/643, 687, 781, 789, 790, 619, 625, 622, 780, 778, 672, 633
See application file for complete search history.

(56) References Cited

U.S. PATENT DOCUMENTS

| 5,102,688 A * | 4/1992 | Hashimoto et al. ........... 438/703 |
| 6,780,517 B2 * | 8/2004 | Chen et al. ..................... 428/447 |
| 2008/0226841 A1 * | 9/2008 | Ravi .............................. 427/585 |

FOREIGN PATENT DOCUMENTS

JP 2006-156519 A 6/2006

* cited by examiner

*Primary Examiner* — Chuong A. Luu
(74) *Attorney, Agent, or Firm* — Fujitsu Patent Center

(57) ABSTRACT

A method of manufacturing a semiconductor device, includes steps of forming an organic insulating film over a semiconductor substrate, irradiating an electron beam to a surface of the organic insulating film, forming recesses in the organic insulating film, forming a conductive material over the organic insulating film and in the recesses, and removing the conductive material on the organic insulating film by a polishing to expose the surface of the organic insulating film and to leave the conductive material buried in recesses of the organic insulating film.

8 Claims, 10 Drawing Sheets

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2008-332602, filed on Dec. 26, 2008, the entire content of which is incorporated herein by reference.

FIELD

The embodiments discussed herein are related to a semiconductor device and a method of manufacturing the same.

BACKGROUND

In the prior art, as a multilayer wiring of LSI, aluminum (Al) or aluminum alloy is employed. As one of the forming methods, such a method is known that a wiring is formed by the dry etching method using a mask and then an insulating film is stacked on the wiring.

In recent years, with the progress of finer patterning of the multilayer wiring, a delay in operation caused by resistance of the wiring material becomes a problem. As the measure to the delay in operation, copper or copper alloy a resistance value of which is lower than aluminum is employed as the wiring material. Meanwhile, in the manufacturing method employing the dry etching method using a mask, it is difficult to pattern the wiring more finely. Thus, the fine pattern of the wiring is formed by employing the damascene method employing the chemical mechanical polishing (CMP) method.

In the common wiring formation by the damascene method, at first a first insulating film acting as a stopper for the dry etching is stacked on a semiconductor substrate, and then a second insulating film is stacked on the first insulating film. Then, a resist pattern is formed on the second insulating film, and then the etching is applied by using the dry etching method while using the resist pattern as a mask. Accordingly, the second insulating film is etched, and wiring recesses are formed. A barrier metal film and a Cu seed film are stacked sequentially in the wiring recesses by the physical vapor deposition (PVD) method. Then, a Cu film is deposited in the wiring recesses by the plating method. Finally, the extra Cu film and the extra barrier metal film in areas other than the wiring recesses are removed by the CMP method.

When the barrier metal film on the surface of the second insulating film is removed by the CMP method, in some cases a polishing time is set longer than a required time. Such polishing may be called the "over polishing". At this time, when slurry for the barrier metal polishing has a high polishing rate of the insulating film and a low polishing rate of the Cu film, the polishing of the Cu film is accelerated relatively with respect to the insulating film. Thus, the Cu film in the wiring recesses is depressed from a surface height of the second insulating film. Such phenomenon may be called the "dishing". For this reason, recently the slurry for the barrier metal polishing, which may be used in polishing the insulating film simultaneously and may suppress a sinking of the Cu wiring, has been developed.

As the second insulating film, a silicon oxide ($SiO_2$) film whose dielectric constant is 4.2 is used. However, when the insulating film whose dielectric constant is high is used, an electric leakage path is readily caused due to a parasitic capacitance of the insulating film in a situation that the wirings are formed as the fine patterns and a distance between the wirings becomes short. Thus, it is discussed nowadays that a low dielectric constant film whose dielectric constant is 3.0 or less should be used as the insulating film.

However, normally a surface of the low dielectric constant film whose dielectric constant is 3.0 or less is covered with a methyl group ($CH_x$), and this low dielectric constant film has hydrophobicity. Thus, the polishing slurry is hardly fitted to the surface of the low dielectric constant film, and thus the polishing is hard to proceed. Also, film strength of the low dielectric constant film is weak, and also adhesion to the underlying insulating film is small. Thus, film peeling is easily caused when this film is polished by the CMP method.

Thus, in the prior art, an oxide film ($SiO_2$) whose dielectric constant is 4.2, for example, is formed as a cap film on the low dielectric constant film, and then the wiring formation and the polishing are applied. Such cap film has a good wettability to the polishing slurry rather than the low dielectric constant film. As a result, the polishing of the insulating film may be proceeded and the dishing may be suppressed. Also, the cap film has a strong film strength and high adhesion, and thus film peeling may be prevented during the polishing. In this case, from a viewpoint of preventing the film peeling, the cap film of predetermined film thickness is left after the polishing is completed.

SUMMARY

According to one aspect of the embodiment, a method of manufacturing a semiconductor device, includes steps of forming an organic insulating film over a semiconductor substrate, irradiating an electron beam to a surface of the organic insulating film, forming recesses in the organic insulating film, forming a conductive material over the organic insulating film and in the recesses, and removing the conductive material over the organic insulating film by a polishing to expose the surface of the organic insulating film and to leave the conductive material buried in recesses of the organic insulating film.

According to other aspect of the embodiment, a semiconductor device, comprising, a semiconductor substrate, an organic insulating film having a first layer formed over the semiconductor substrate, and a second layer provided over the first layer and formed by substituting at least apart of a methyl group in the first layer with a hydroxy group and a conductive material buried in recesses of the organic insulating film.

The object and advantage of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the present invention will be described with reference to the accompanying drawings. Throughout the drawings, similar symbols and numerals indicate similar items and functions.

Figure 1A:
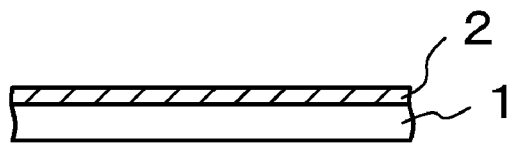
FIGS. 1A to 1Q are views for explaining steps of manufacturing a semiconductor device.

First, as illustrated in FIG. 1A, a first insulating film 2 is stacked on a semiconductor substrate 1 by the chemical vapor deposition (CVD) method to have a film thickness of 10 nm to 200 nm, for example. As the semiconductor substrate 1, for example, a silicon substrate may be employed. Also, although illustration is omitted, transistors, metal wirings, and contact plugs are formed on lower layers of the first insulating film 2. The first insulating film 2 in this step acts as a stopper film in the etching step described later. As the material, for example, a silicon carbide film (SiC), a silicon carbide nitride film (SiCN), or a silicon nitride film (SiN) is employed. The first insulating film 2 may have a structure that two thin films or more are stacked. Also, these films may be combined with an oxide film (SiO), a silicon carbide oxide film (SiOC), or the like.

Figure 1B:
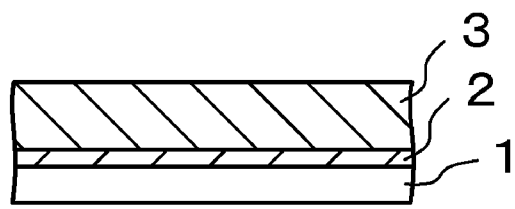

Then, as illustrated in FIG. 1B, a low dielectric constant insulating film 3 is formed by any one of the CVD method, the PE-CVD method, and the rotary coating method, or a combination of these methods on the first insulating film 2. A film thickness of the low dielectric constant insulating film 3 is set to 100 nm to 1000 nm, for example. A film thickness of the low dielectric constant insulating film 3 formed in this step has a value that is obtained by adding a film thickness, which is removed by the polishing in the polishing step described later, to a film thickness required as an interlayer insulating film.

The low dielectric constant insulating film 3 is an insulating film which contains organic substances and whose dielectric constant is 3.0 or less, and is stacked by using the material selected from a group consisting of organic silane, organic siloxane with a methyl group. More concretely, the low dielectric constant insulating film 3 is formed by using the material that is formed of any one of methylsilane, dimethylsilane, trimethylsilane, tetramethylsilane, phenylsilane, methylphenylsilane, cyclohexylsilane, ethylsilane, diethylsilane, tetraethoxysilane, dimethyldiethoxysilane, dimethyldimethoxysilane, dimethylethoxysilane, methyldiethoxysilance, triethoxysilane, trimethylphenoxysilane, phenoxysilane, diethoxysilane, diacetoxymethylsilane, methyltriethoxysilane, di-tert-butylsilane, tert-butylsilane, 1,3,5,7-tetramethylcyclotetrasiloxane, octamethylcyclotetrasiloxane, hexamethylcyclotrisiloxane, hexamethyldisiloxane, 1,1,2,2-tetramethyldisiloxane, and octamethyltrisiloxane, or their combination. Also, porogen may be contained in the low dielectric constant insulating film 3 to lower a dielectric constant.

Now, a method of forming the low dielectric constant insulating film 3 will be explained below by taking the rotary coating method as an example.

At first, a coating chemical liquid is coated on a surface of the first insulating film 2 by the spin coating method. As the coating chemical liquid, NCS (Nano Crystalline Silica) manufactured by Catalysts & Chemicals Industries Co., Ltd., for example, is employed. The number of revolution of the semiconductor substrate 1 is set to 1000 rpm to 5000 rpm, for example. Then, the semiconductor substrate 1 is baked in a temperature atmosphere of 150° C. to 300° C. for 3 min to 10 min to evaporate a solvent, for example. Then, the semiconductor substrate 1 is loaded in the diffusion furnace, and a curing process for a bridging reaction is applied in a temperature atmosphere of 400° C. for 30 min.

As the low dielectric constant insulating film suitable for the rotary coating method, in addition to the above, there are LKD (product name) manufactured by JSR Corporation, Polus Silk (product name) manufactured by The Dow Chemical Co., Scaleable Polus Silica manufactured by ULVAC Inc., Mitsui Chemicals Inc., or the like.

Also, as the low dielectric constant insulating film suitable for the CVD method, there are Black Diamond (product name) manufactured by AMAT Inc., Aurora (product name) manufactured by ASM Inc., CORAL (product name) manufactured by Novellus Systems Inc., or the like.

Figure 1C:
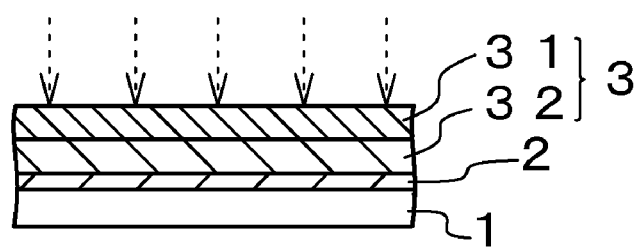
Figure 2A:
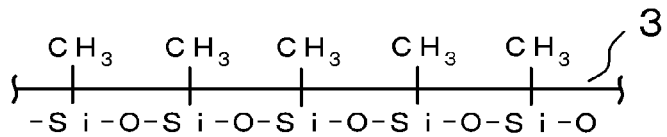
FIGS. 2A to 2C are conceptual views for explaining a step of irradiating an electron beam.

Then, as indicated by an arrow in FIG. 1C, a step of irradiating an electron beam is executed. In this step, the electron beam is irradiated onto the low dielectric constant insulating film 3 from the surface side. Before the electron beam is irradiated, the low dielectric constant insulating film 3 has a chemical structure, as schematically illustrated in FIG. 2A. The low dielectric constant insulating film 3 exhibits hydrophobicity because it has the methyl group (CHx). Thus, such low dielectric constant insulating film 3 has a poor wettability to an abrasive, or the like.

Figure 2B:
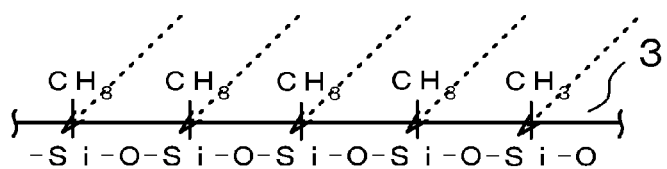

Thus, as illustrated in FIG. 2B, a surface of the low dielectric constant insulating film 3 is reformed by irradiating the electron beam onto the surface. As the irradiation conditions of the electron beam, for example, an acceleration voltage is set to 2 keV to 4 keV, an amount of dose is set to 50 $\mu C/cm^2$ to 400 $\mu C/cm^2$, and a processing temperature is set to 200° C. to 500° C. When the irradiation conditions of the electron beam are out of these ranges, it becomes hard to get the satisfactory reformed layer in polishing.

Figure 2C:
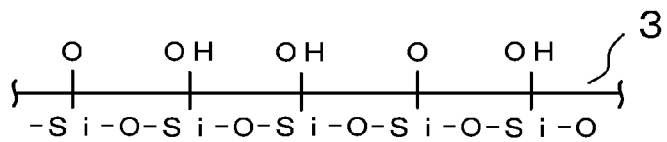

When the electron beam is irradiated, the bond between the silicon (Si) and the methyl group ($CH_x$) of the low dielectric constant insulating film 3 is cut off. Accordingly, the portion of the low dielectric constant insulating film 3, onto which the electron beam is irradiated, is easily bonded with other elements, or the like. Thus, as illustrated in FIG. 2C, a hydroxy group (OH) or oxygen (O) may be bonded with Si. As a result, the methyl group is changed into the hydroxy group, and a part of the low dielectric constant insulating film 3 becomes hydrophilicity. The hydroxy group or the oxygen may be bonded with Si when a resist is coated in the later step, or the like.

Figure 3:
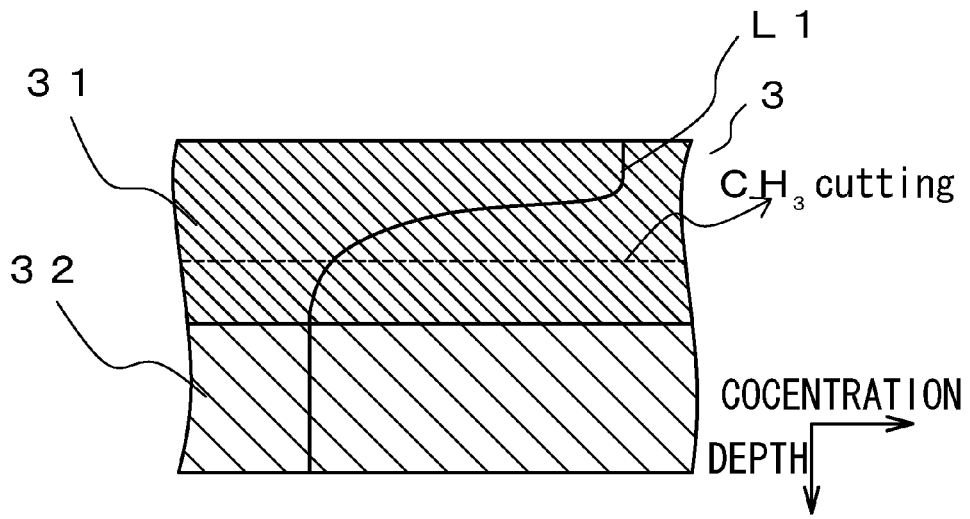
FIG. 3 is a conceptual view of a reformed layer.

When the step of irradiating the electron beam is executed in this manner, a reformed layer (second layer) 31 in which a concentration of the methyl group is relatively low is formed on the surface of the low dielectric constant insulating film 3 to have a predetermined thickness, as illustrated in FIG. 3. The reformed layer 31 shows hydrophilicity since a concentration of the methyl group is low. A thickness of the reformed layer 31 may be controlled by an acceleration voltage in irradiating the electron beam, a dose, a processing temperature, a pressure atmosphere, and film forming conditions of the low dielectric constant insulating film.

An example of a concentration distribution of the cutting of the bond between Si and the methyl group, i.e., a change of concentration of the hydroxy group, in the reformed layer 31 is indicated by a line L1 in FIG. 3. A rate of cutting the bond between Si and the methyl group becomes lower as the film thickness becomes deeper. In other words, a concentration of the hydroxy group is highest on the outermost surface of the reformed layer 31, and a concentration distribution of the hydroxy group is gradually lowered toward a non-reformed layer (first layer) that is not reformed.

Figure 4:
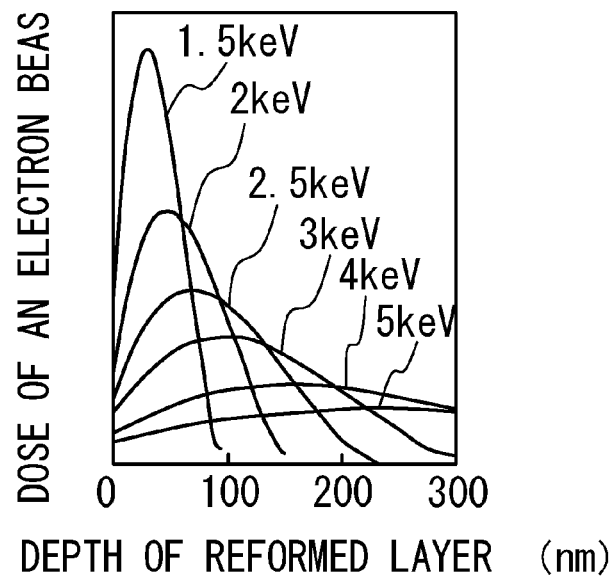
FIG. 4 is a view illustrating a simulation result of a relationship between a dose of an electron beam and a buried depth.

Also, the simulation result of a depth of the reformed layer 31 when NCS (Nano Crystalline Silica) manufactured by Catalysts & Chemicals Industries Co., Ltd. is employed as the low dielectric constant insulating film 3 is illustrated in FIG. 4. FIG. 4 illustrates a relationship between a depth of the reformed layer 31 and a dose of the electron beam when an acceleration voltage of the electron beam is changed in a range from 1.5 keV to 5 keV. The reformed layer 31 may be deepened, i.e., the reformed layer 31 may be thickened, by increasing an acceleration voltage in irradiating the electron beam. The reason for this may be considered such that, when an acceleration voltage is increased higher, the electron beam may be implanted to the deeper area.

Figure 5:
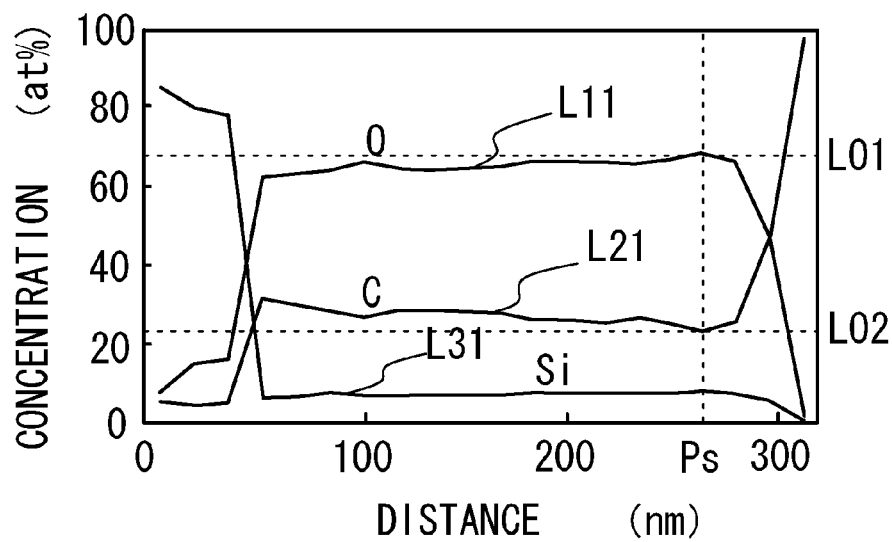
FIG. 5 is a view illustrating a measured concentration of a low dielectric constant insulating film in a film thickness direction before an irradiation of the electron beam.
Figure 6:
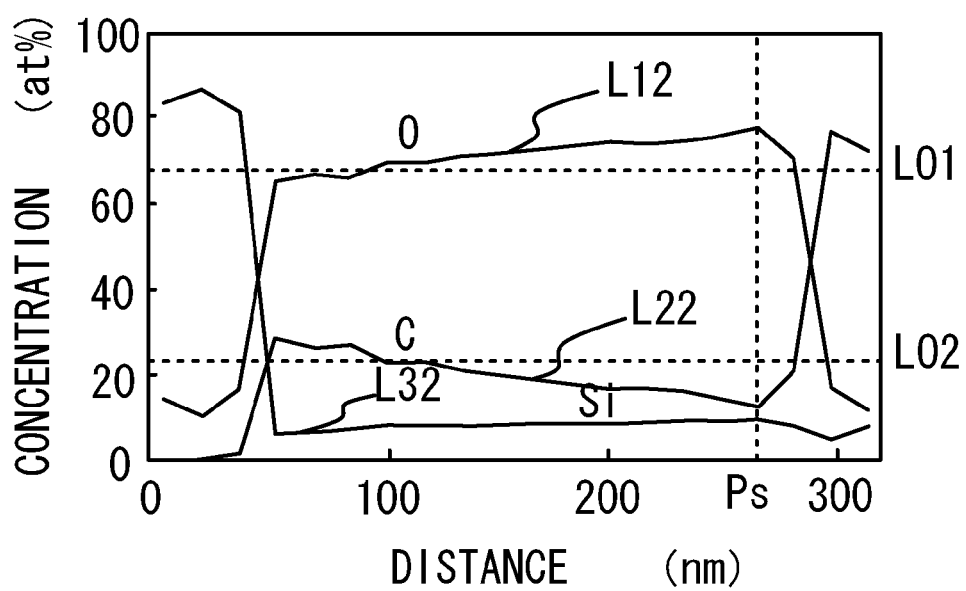
FIG. 6 is a view illustrating a measured concentration of the low dielectric constant insulating film in the film thickness direction after the irradiation of the electron beam.

Also, in FIG. 5 and FIG. 6, results of oxygen and carbon concentrations contained actually in the low dielectric constant insulating film 3, which were measured by the electron energy loss spectroscopy (EELS) method before and after the reformation is applied respectively, are illustrated.

FIG. 5 illustrates the measured result before the reformation is applied, i.e., before an irradiation of the electron beam is made. An abscissa denotes a distance in the film thickness direction of the low dielectric constant insulating film 3, and an ordinate denotes concentrations of oxygen, carbon, and Si in this film. A line L11 indicates an oxygen concentration, a line L21 indicates a carbon concentration, and a line L31 indicates an Si concentration. Also, Ps on the abscissa indicates a surface and its neighborhood of the low dielectric constant insulating film 3. An oxygen concentration indicated by the line L11 and a carbon concentration indicated by the line L21 were substantially constant (see lines LO1, LO2) respectively irrespective of depth before the irradiation of the electron beam is made.

In contrast, FIG. 6 illustrates the measured result after the reformation is applied, i.e., after the irradiation of the electron beam is made. An acceleration voltage in irradiating the electron beam was set to 2 keV. After the reformation was applied, the oxygen concentration indicated by the line L12 was increased in a range from the surface Ps and its neighborhood to a depth of about 170 nm, i.e., a range from the surface of the low dielectric constant insulating film 3 to a depth of about 170 nm. Similarly, the carbon concentration indicated by the line L22 was decreased from the surface Ps and its neighborhood to a depth of about 170 nm. It may be understood from this result that a depth (thickness) of the reformed layer 31 formed by irradiating the electron beam was about 170 nm. Also, it may be understood that, in the area corresponding to the reformed layer 31, the oxygen concentration was increased gradually in the depth direction and the carbon concentration was decreased gradually in the depth direction and hence concentration gradients of the carbon and the oxygen were formed in the film thickness direction in the reformed layer 31.

When the experimental result in FIG. 6 is compared with the simulations result in FIG. 4, a depth of the reformed layer was about 160 nm in FIG. 4 when the acceleration voltage of the electron beam was set to 2 keV. From this result, it is appreciated that a depth of the reformed layer could be controlled by a magnitude of the acceleration voltage. In this manner, a depth of the reformed layer may be controlled when a correlation between the EB curing conditions and the depth of the reformed layer 31 is examined in advance.

In this case, a depth Dh of the reformed layer 31 may be calculated when a product of 0.046 (constant) and 1.75 times of the acceleration voltage (Vcc [keV]) of the electron beam is divided by a film density ($\rho$ [g/cm$^3$]) of the low dielectric constant insulating film 3, for example, as given by Dh=0.046×1.75 Vcc/$\rho$.

Figure 1D:
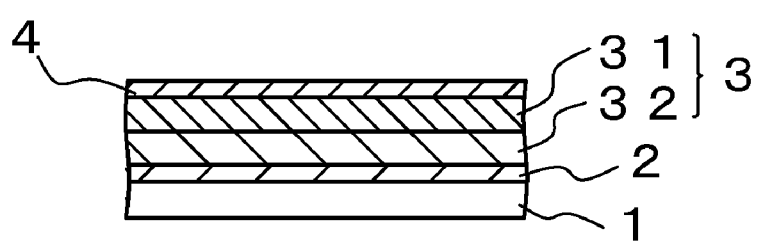

As explained above, a part of the low dielectric constant insulating film 3 is reformed and then a step of stacking a hard mask insulating film is executed, as illustrated in FIG. 1D.

First, a second insulating film 4 of 10 nm to 150 nm thickness is stacked on the low dielectric constant insulating film 3 whose surface has been reformed, by the CVD method, the PE-CVD method, or the PVD method. This second insulating film 4 serves as a hard mask for the etching. As the second insulating film 4, for example, an insulating film such as a silicon dioxide film (SiO$_2$), a silicon carbide film (SiC), a silicon oxide carbide film (SiOC), a silicon carbide nitride film (SiCN), a silicon nitride film (SiN), or the like, or a metal film, or the like is employed. Also, a single layer or two stacked layers or more of these films may be employed. In this case, in light of workability in the etching or the CMP method, it is desirable that the second insulating film 4 may be formed of the silicon dioxide film (SiO$_2$).

Figure 1E:
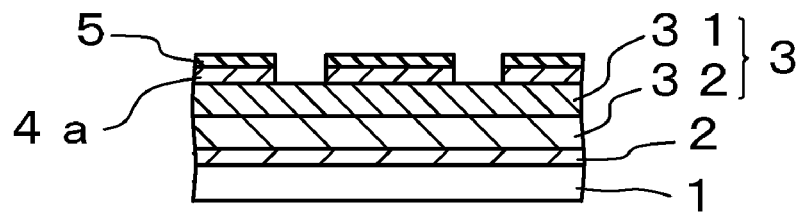

Then, as illustrated in FIG. 1E, a patterning step is executed.

That is, a photoresist is coated on the second insulating film 4 and then exposed and developed. Thus, a resist pattern 5 having openings that are aligned with positions of the wiring recesses is formed. Then, the second insulating film 4 is etched by the RIE (Reactive Ion Etching) while using the resist pattern 5 as a mask. Thus, a profile of the wiring recesses is transferred onto the second insulating film 4. Accordingly, a hard mask 4a formed of the second insulating film 4 is formed.

Figure 1F:
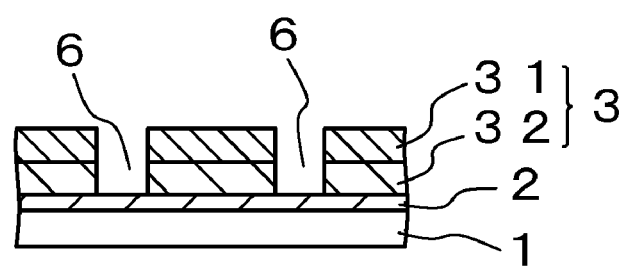

Then, as illustrated in FIG. 1F, an etching step is executed.

The low dielectric constant insulating film 3 is etched by using the hard mask 4a formed by using the second insulating film 4. Thus, recess patterns 6 are formed on the low dielectric constant insulating film 3. The etching is applied while changing individually an etching gas for respective insulating films 2 to 4.

A CF$_4$ gas is employed in forming the insulating films 3, 4. A selective etching ratio of the low dielectric constant insulating film 3 and the first insulating film 2 against the CF$_4$ gas is relatively large. Thus, the etching of the low dielectric constant insulating film 3 stops at the first insulating film 2. In this case, when the first insulating film 2 is etched, a mixed gas consisting of a CF$_4$ gas and an O$_2$ gas is employed.

After the etching is ended, the resist pattern 5 is removed by the asking. In this case, the resist pattern 5 and the hard mask 4a may be removed completely at a time of etching of the low dielectric constant insulating film 3. Also, the hard mask 4a may be still left in this step, and the hard mask 4a may be removed by the polishing applied by the CMP method in the later step.

Figure 1G:
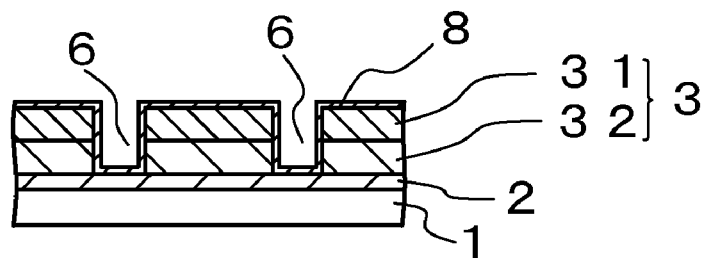

Then, as illustrated in FIG. 1G, a step of stacking the barrier metal is executed.

In order to cover the outermost surface of the low dielectric constant insulating film 3 and inner surfaces of recess patterns 6, a conductive film 8 of 1 nm to 30 nm thickness is formed by the PVD method, e.g., the sputter method. This conductive film 8 serves as the barrier metal film. This conductive film 8 is stacked to prevent such a situation that Cu used as the wiring material is diffused into the low dielectric constant insulating film 3. As the conductive film 8, for example, tantalum nitride (TaN) is employed. As the stacking conditions, a $N_2$ gas and an Ar gas, for example, are supplied at a flow rate ratio of $N_2$:Ar=20:80, and an electric power of 1 kW to 40 kW, for example, is applied to a Ta target. As a result, the Ta reacts with the $N_2$ gas.

As the conductive film 8 serving as the barrier metal film, any one metal or a plurality of metals out of titanium (Ti), nickel (Ni), cobalt (Co), zirconium (Zr), chromium (Cr), palladium (Pd), manganese (Mn), silver (Ag), aluminum (Al), tin (Sn), tantalum (Ta), rhenium (Re), tungsten (W), platinum (Pt), vanadium (V), ruthenium (Ru), and gold (Au), or their nitride may be employed. As the method of stacking the barrier metal, in addition to the PVD method, any one of the CVD method, the PE-CVD method, and the PE-ALD method or their combination may be employed. Also, like the high-density plasma CVD method, the step of forming the conductive film 8 may be executed under the conditions that at least a part of the conductive film 8 is etched and also the conductive film 8 is grown. Accordingly, adhesion of the side walls of the recess patterns 6 is improved.

Figure 1H:
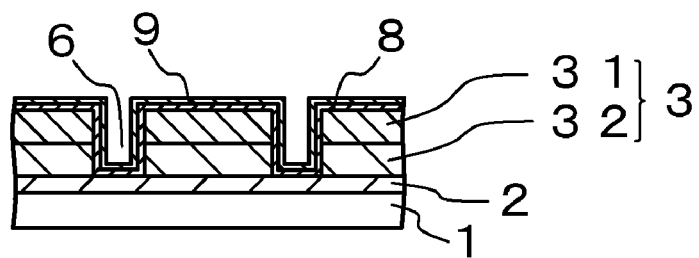

Then, a step of stacking a Cu seed film will be explained below with reference to FIG. 1H.

A seed film 9 formed of Cu is stacked on the conductive film 8 by the PVD method, for example, the sputter method to have a film thickness of 1 nm to 100 nm. In this case, an electric power of 1 kW to 40 kW, for example, is applied to the Cu target in an Ar gas atmosphere. As the film forming method, the CVD method, the ALD method, the PE-CVD method, the ALD method, or the PE-ALD method may be employed, in addition to the PVD method.

As the seed film 9, a film into any one element or two elements or more out of Ti, Ni, Co, Zr, Cr, Pd, Mn, Ag, Al, Sn, Ta, Re, W, Pt, V, Ru, Au, Si, Ge, C, S, O, Cl, P, B, H, Hf, F, and N are mixed may be employed.

Figure 1I:
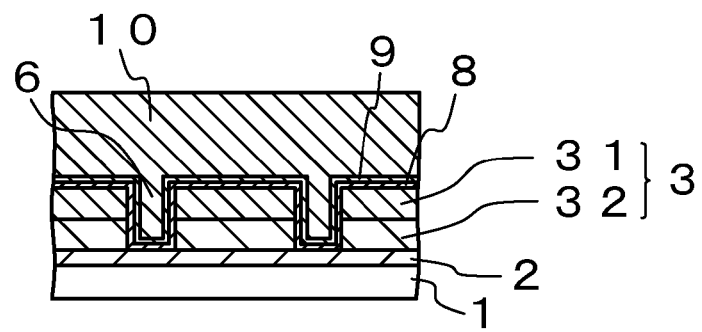

Then, as illustrated in FIG. 1I, a step of forming a plating layer 10 in the recess patterns 6 will be explained below.

In this case, the seed film 9 is used as a power feeding portion, and Cu serving as the wiring material is deposited on the seed film 9. Thus, the recess patterns 6 are buried by the wiring material. A thickness of the plating layer 10 is set to exceed a film thickness of the low dielectric constant insulating film 3, e.g., 1.2 µm. Accordingly, Cu is filled in the recess patterns 6, and Cu of predetermined thickness is deposited on the surface of the low dielectric constant insulating film 3.

In this case, as the Cu of the wiring material, the Cu into any one element or two elements or more out of Ti, Ni, Co, Zr, Cr, Pd, Mn, Ag, Al, Sn, Ta, Re, W, Pt, V, Ru, Au, Si, Ge, C, S, O, Cl, P, B, H, Hf, F, and N are mixed may be employed. As the film forming method, the CVD method, the ALD method, the PE-CVD method, or the PE-ALD method may be employed, in addition to the plating method.

Then, a step of polishing the plating layer 10, the seed film 9, the conductive film 8, and the low dielectric constant insulating film 3 will be explained below.

Figure 7:
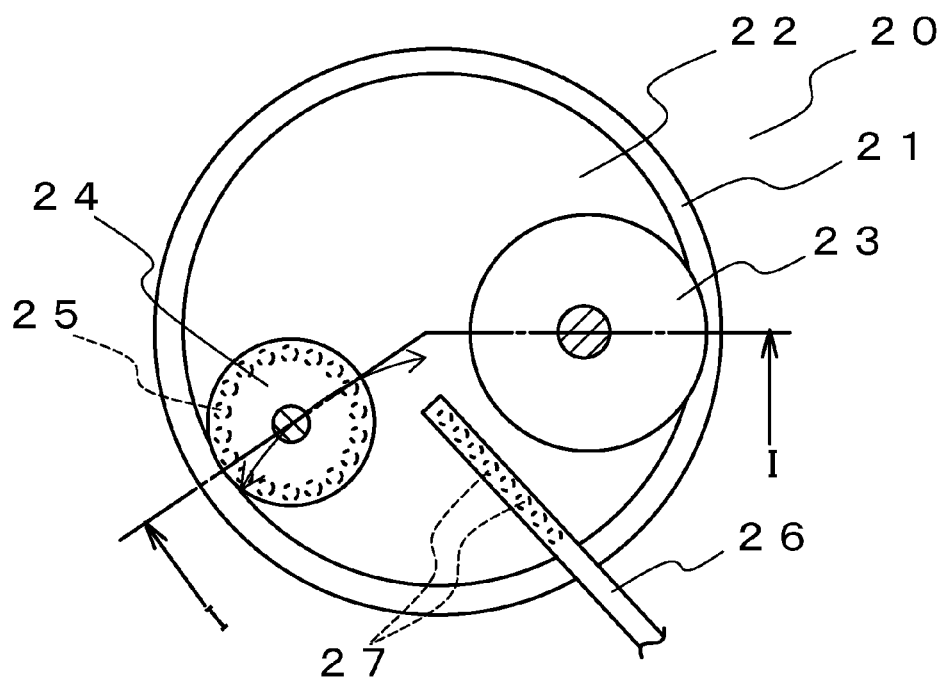
FIG. 7 is a plan view of a polishing machine.
Figure 8:
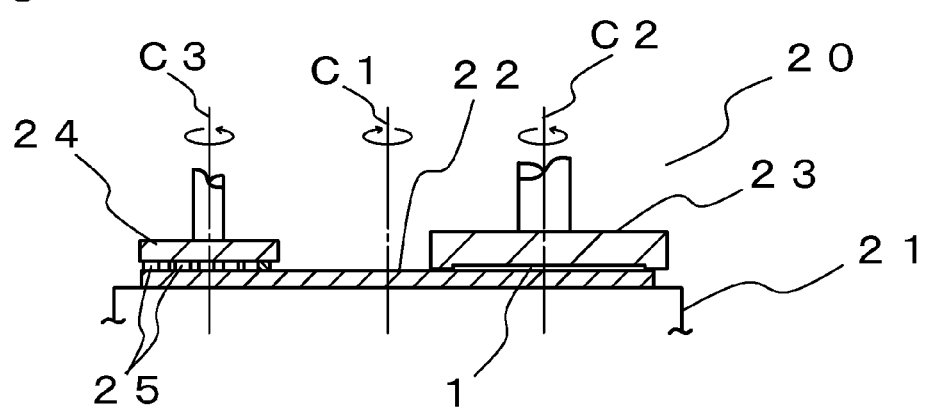
FIG. 8 is a sectional view taken along a I-I line in FIG. 7.

As the polishing step used herein, for example, the rotary polishing method may be employed. FIG. 7 and FIG. 8 illustrate an example of a polishing machine. In FIG. 7 and FIG. 8, an arrow indicates the direction of rotation or an operational range of the mechanism.

As illustrated in FIG. 7, a polishing machine 20 is equipped with a worktable 21, and a polishing pad 22 for holding a polishing abrasive liquid is pasted on an upper surface of the worktable 21. As the polishing pad 22, a double-layered product of polyurethane form and a nonwoven fabric (IC 1000/Suba 400 manufactured by Rohm and Haas Company), for example, was employed.

A polishing head 23 for holding the semiconductor substrate 1 is arranged on the polishing pad 22. The polishing head 23 holds the semiconductor substrate 1 such that the polished surface, i.e., the plating layer 10 is directed downward. Also, a pushing mechanism (not illustrated) is provided to the polishing head 23, and may push the semiconductor substrate 1 against the polishing pad 22.

Also, a dresser 24 used as a conditioner of the polishing pad 22 is arranged over the polishing pad 22. A plurality of diamond abrasive grains 25 are fitted to a lower surface of the dresser 24, which contacts the polishing pad 22. Accordingly, a surface state of the polishing pad 22 may be adjusted.

The polishing machine 20 is constructed such that the polishing pad 22, the polishing head 23, and the dresser 24 may be rotated independently upon a rotation shaft C1, a rotation shaft C2, and a rotation shaft C3 respectively. Also, the dresser 24 is constructed such that this dresser 24 may be moved on the polishing pad 22 along a circular arc indicated by an arrow.

As the polishing conditions herein, for example, the number of rotation of the worktable 21 was set to 70 rpm, and the number of rotation of the polishing head 23 was set to 71 rpm. A polishing pressure was set to $1.4000 \times 10^4$ Pa (2.0 psi), for example.

The polishing is carried out while supplying the polishing abrasive liquid onto the polishing pad 22. The polishing abrasive liquid is supplied from a plurality of nozzles 27. The nozzles 27 are opened downward in a polishing abrasive liquid supply arm 26 that is extended over the polishing pad 22. As the polishing abrasive liquid, the abrasive liquid that contains chemical substances such as dispersing agent, oxidizing agent, anticorrosives, chelating agent, or the like in colloidal silica abrasive grains is employed. As the abrasive grains, the grains containing any one of colloidal silica, fumed silica, cerium, and silicon carbide, for example, may be employed. As the dispersing agent, the agent containing potassium hydroxide or ammonium, for example, may be employed. As the oxidizing agent, ammonium peroxodisulfate or hydrogen peroxide liquid, for example, may be employed. As the anticorrosives, benzotriazole (BTA), for example, may be employed. As the chelating agent, citric acid or malic acid, for example, may be employed.

As the polishing abrasive liquid employed in the present embodiment, the acidic polishing abrasive liquid whose polishing rate is extremely lowered when it is applied to the hydrophobic film formed of the methyl group ($CH_x$) is employed. The reforming agent used to accelerate hydrophilization is not contained.

Alternatively, the alkaline polishing abrasive liquid may be employed. In this case, the slurry easily agrees with the alkaline polishing abrasive liquid. But a polishing rate of the alkaline polishing abrasive liquid is extremely increased when this liquid is applied to the weak low dielectric constant insulating film 3, and hence the control of the polishing becomes difficult. Thus, it is preferable that the polishing abrasive liquid in which one or plural surface active agents or reforming agents out of anionic, cationic, nonionic, and non-ionic agents are contained so as to form a protection film on the low dielectric constant insulating film 3 may be employed.

Then, processes of the polishing by the CMP method will be explained below with reference to FIG. 1J to FIG. 1L.

Figure 1J:
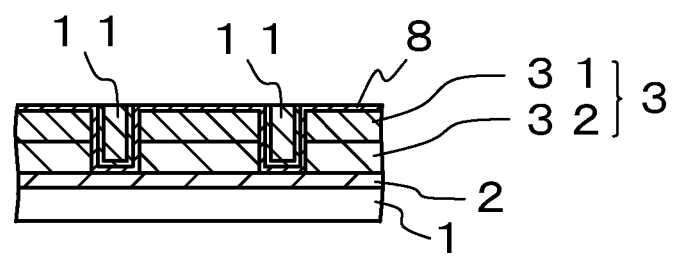
Figure 1K:
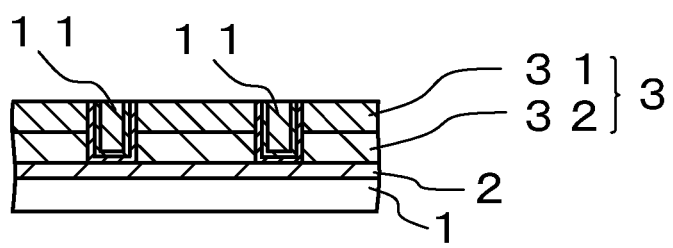
Figure 1L:
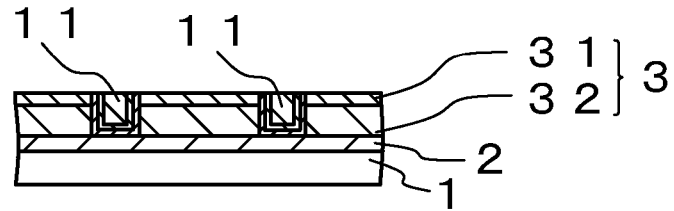

As illustrated in FIG. 1J, at first the plating layer 10 formed of the wiring material and the seed film 9 are removed by the first polishing. Then, as illustrated in FIG. 1K, the conductive film 8 is removed by the second polishing. Hence, the outermost surface of the low dielectric constant insulating film 3, i.e., the reformed layer 31 is exposed. Then, as illustrated in FIG. 1L, at least a part of the reformed layer 31 of the low dielectric constant insulating film 3 as well as the wiring material is removed by the third polishing. As a result, conductive patterns 11 acting as the wirings are formed on the low dielectric constant insulating film 3. In this case, only the non-reformed layer 32 may be left by removing the reformed layer 31 completely from the low dielectric constant insulating film 3.

As the polishing abrasive liquid employed in the first polishing, such an abrasive liquid is employed that the plating layer 10 and the seed film 9 may be polished at a high polishing rate and the polishing rate applied to the conductive film 8 and the low dielectric constant insulating film 3 is extremely lowered. As the polishing abrasive liquid suitable for such polishing, for example, there are HS-H635 (product name), HS-C930 (product name), or the like manufactured by Hitachi Chemical Co., Ltd.

As the polishing abrasive liquid employed in the second polishing and the third polishing, such an abrasive liquid is employed that the conductive film 8, the conductive patterns 11 in the recess patterns 6, and the reformed layer 31 of the low dielectric constant insulating film 3 may be polished at the similar polishing rate and a polishing rate applied to the non-reformed layer 32 of the low dielectric constant insulating film 3 is extremely lowered. As the polishing abrasive liquid suitable for such polishing, for example, T605-8 (product name) manufactured by Hitachi Chemical Co., Ltd. is listed as the acidic agent. Also, CMS8201/8252 (product name), CMS8501/8552 (product name), or the like manufactured by JSR Corporation are listed as the alkaline agent.

Figure 9:
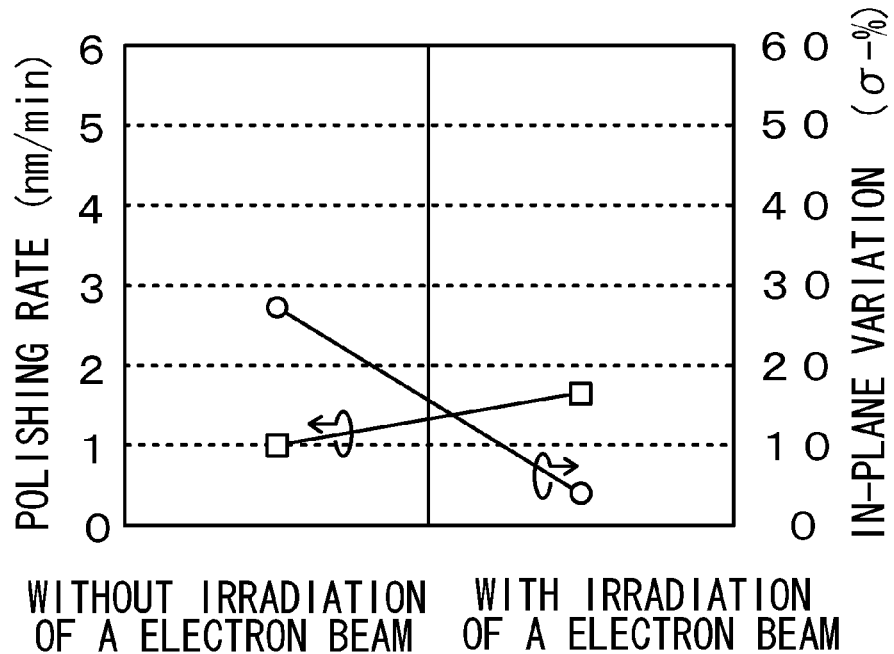
FIG. 9 is a view illustrating comparison between a resultant polishing rate of the low dielectric constant insulating film and resultant in-plane variation of polishing when the electron beam is not irradiated.
Figure 10:
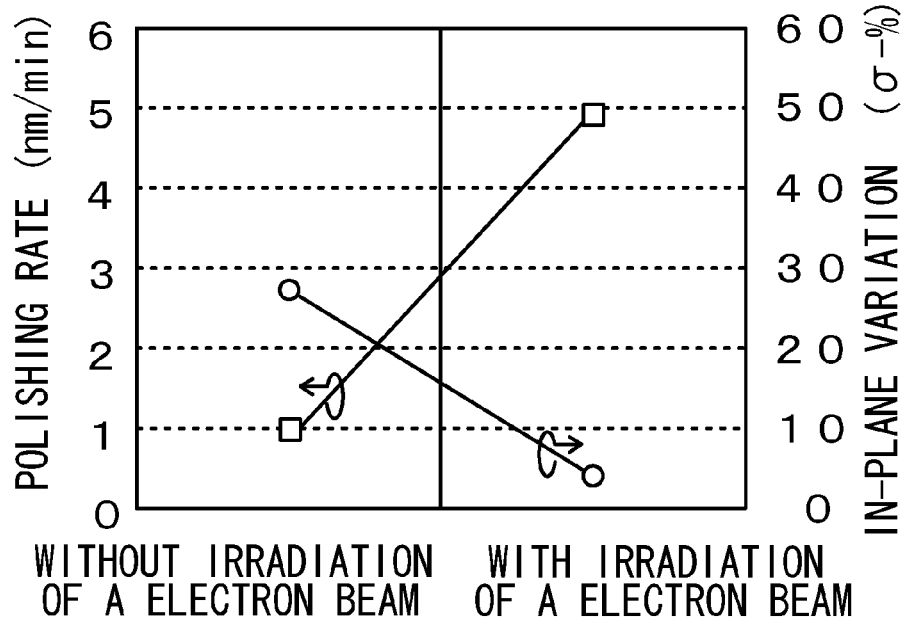
FIG. 10 is a view illustrating comparison between the resultant polishing rate of the low dielectric constant insulating film and the resultant in-plane variation of polishing after the electron beam is irradiated.

FIG. 9 and FIG. 10 illustrate comparisons between resultant polishing rates and resultant in-plane variations of polishing for the low dielectric constant insulating film 3, to which the irradiation of the electron beam has been applied, and the low dielectric constant insulating film 3, to which the irradiation of the electron beam has not been applied, are illustrated. In particular, FIG. 9 illustrates comparison between the resultant polishing rate and the resultant in-plane variation of polishing when the polishing agent to which the surface active agent is not added is employed. FIG. 10 illustrates comparison between the resultant polishing rate of and the resultant in-plane variation of polishing when the polishing agent to which the surface active agent is not added is employed. In both cases, NCS (Nano Crystalline Silica) manufactured by Catalysts & Chemicals Industries Co., Ltd. was employed as the low dielectric constant insulating film 3, and the acceleration voltage of the electron beam was set to 2 keV. Also, the polishing was carried out under the same conditions as mentioned above.

Based on this result, it was found that, when the irradiation of the electron beam is applied, a difference may be produced in the polishing rate of the same low dielectric constant insulating film 3 regardless of whether or not the surface active agent is used. From the above, the insulating film that has naturally hydrophobicity may be polished easily by applying the irradiation of the electron beam. Even though the cap layer is not provided unlike the prior art, the low dielectric constant insulating film 3 may be polished directly. Thus, the multi-layer wiring may be formed by using a low-k insulating film.

When the surface active agent that forms the firm protection film was added to the polishing abrasive liquid as illustrated FIG. 10, a difference in the polishing rate caused by the irradiation of the electron beam could be increased much more. It may be appreciated from this fact that, when the reforming agent such as the surface active agent, or the like is added to the polishing abrasive liquid, a ratio of the polishing rate may be controlled.

This difference in the polishing rate may also be considered as a difference in the polishing rate between the reformed layer 31, which has been formed by the irradiation of the electron beam, and the non-reformed layer 32, which has not been subjected to the irradiation of the electron beam, particularly a difference in concentration of the cutting of the $Si-CH_3$ bond. In particular, since the cutting of the $Si-CH_3$ bond becomes fewer as illustrated in FIG. 3 as the reformed layer 31 becomes deeper in the film thickness direction, a difference in the polishing rate is caused even in the reformed layer 31. That is, the polishing proceeds at a high polishing rate when the reformed layer 31 is polished at first in the polishing step, while a polishing rate is lowered as a depth of the reformed layer 31 is increased and when a depth reaches the non-reformed layer 32. For this reason, even after the polishing proceeded, the non-reformed layer 32 is hardly polished and the polishing step may be ended. Namely, the polishing may be completed before a sudden difference in the polishing rate is caused between the reformed layer 31 and the Cu film constituting the conductive pattern 11, and as a result the dishing may be prevented.

Particularly, a rate of conversion from the methyl group of the low dielectric constant insulating film 3 to the hydroxy group is changed gradually in the film thickness direction. And a distribution of concentration of the hydroxy group in the outermost surface is highest and a concentration of the hydroxy group on the side of the non-reformed layer 32 is lowest. Thus, the polishing rate may be lowered gradually. As a result, a thickness of the low dielectric constant insulating film 3 may be easily adjusted to a desired film thickness while preventing the dishing.

Further, when a difference in the polishing rate between the reformed layer 31 and the non-reformed layer 32 or a difference in the polishing rate caused due to a change of concentration of the hydroxy group in the reformed layer 31 is utilized, an amount of polishing may be controlled either by monitoring the load applied to the polishing head 23 based on an electric current value or by measuring a frictional resistance by using the torque monitor. As a result, the more precise film thickness control may be achieved.

Also, even when the film thickness is varied before the polishing or in the initial stage of the polishing due to a difference in the polishing rate caused by the irradiation of the electron beam, the polishing rate is lowered gradually as the film thickness of the reformed layer 31 becomes thinner. Thus, a variation in the plane of the remaining film may be reduced gradually. Also, the reformed layer 31 may be easily polished, and thus film peeling of the low dielectric constant insulating film 3 may be prevented.

Then, the conductive patterns 11 serving as the wirings (first conductive patterns) are formed, as described above, and then the second patterns serving as the second layers are formed on the low dielectric constant insulating film 3 and are connected electrically to the first-layer conductive patterns 11 via the conductive patterns 11. As a result, a multilayer wiring structure may be formed.

Figure 1M:
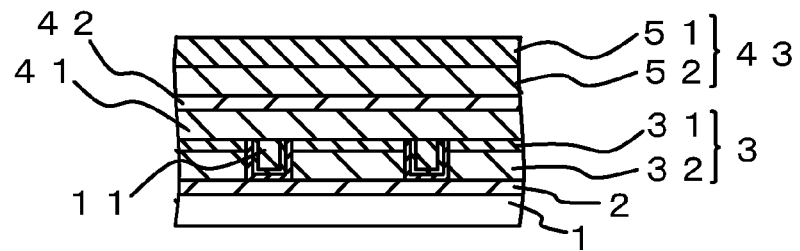

First, as illustrated in FIG. 1M, an interlayer insulating film 41 whose dielectric constant is 3.0 or less, a third insulating film 42 acting as an etching stopper film, and a low dielectric constant insulating film 43 whose dielectric constant is 3.0 or less are formed in order on the low dielectric constant insulating film 3. The material of the forming method of the interlayer insulating film 41 and the low dielectric constant insulating film 43 are similar to those of the low dielectric constant insulating film 3. Also, the material of the forming method of the third insulating film 42 is similar to those of the first insulating film 2.

Also, a reformed layer 51 (second layer) is formed by irradiating the electron beam onto a surface of the low dielectric constant insulating film 43. The reformed layer 51 is formed when the methyl group of the low dielectric constant insulating film 43 is substituted with the hydroxy group. A concentration of the hydroxy group of the outermost surface is highest, and a distribution of the concentration of the hydroxy group is lowered gradually toward a non-reformed layer 52 (first layer) that is not reformed.

Figure 1N:
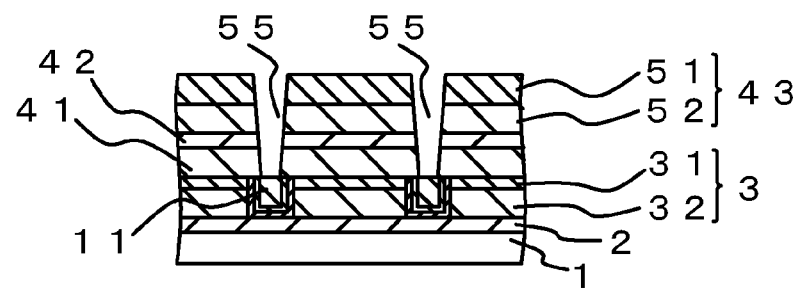

Then, as illustrated in FIG. 1N, the dry etching is applied while using a hard mask. Thus, contact holes 55 each exposing the wiring and the conductive pattern 11 are formed.

Figure 1O:
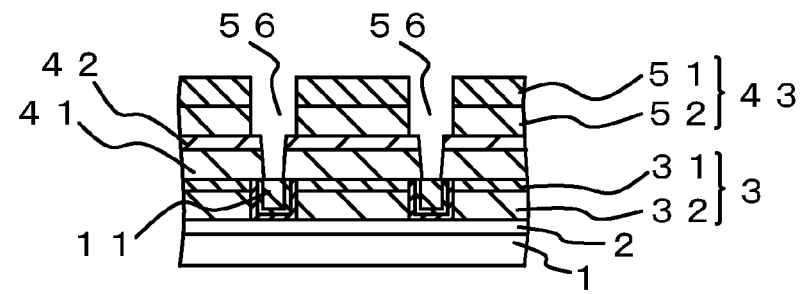

Also, as illustrated in FIG. 1O, the dry etching is applied while using a hard mask. Thus, recess patterns 56 for the wirings are formed in the low dielectric constant insulating film 43. In the etching at this time, since the third insulating film 42 acts as a stopper, the recess patterns 56 are never formed in the interlayer insulating film 41.

Figure 1P:
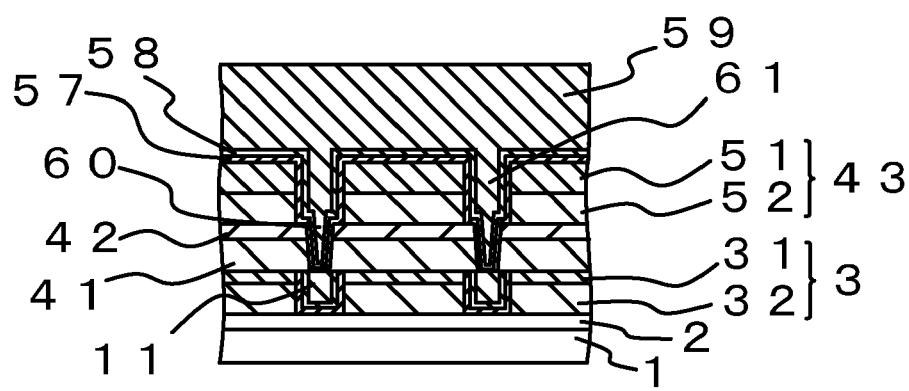
Figure 1Q:
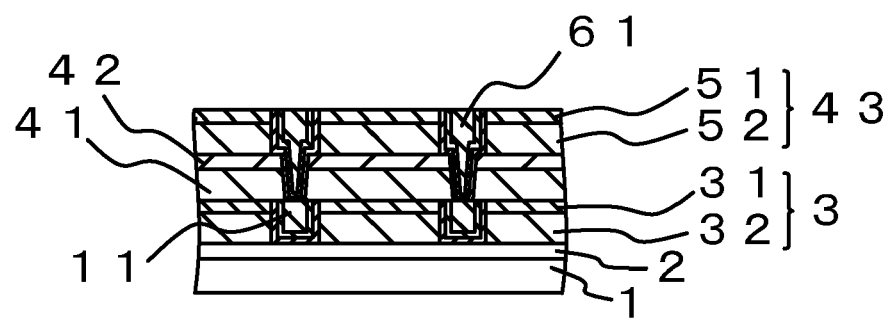

Then, as illustrated in FIG. 1P, like the above, a conductive film 57 acting as the barrier metal film and a seed film 58 are formed in order by the sputter method, for example. Then, a plating layer 59 formed of Cu as the wiring material is deposited by the plating method using the seed film 58 as a power feeding portion to fill the contact holes 55 and the recess patterns 56. Accordingly, as illustrated in FIG. 1Q, a conductive plug 60 is formed in the contact holes 55 respectively and a conductive pattern 61 serving as the wiring is formed in the recess patterns 56 respectively.

Then, the polishing step is executed like the above by the polishing machine, as illustrated in FIG. 7 and FIG. 8. That is, the plating layer 59 and the seed film 58 are removed from an upper surface of the low dielectric constant insulating film 43 in the first polishing, and the conductive film 57 is removed in the second polishing. Then, at least a part of the reformed layer 51 of the low dielectric constant insulating film 43 as well as the wiring material is removed in the third polishing. Accordingly, the upper conductive pattern 61 (second conductive pattern) of a desired film thickness is formed in the recess patterns 56 of the low dielectric constant insulating film 43. The conductive pattern 61 is connected electrically to the lower conductive pattern 11 via the conductive plug 60.

The similar steps are repeated in forming the third layer et seq. As a result, the multilayer wiring structure may be implemented while suppressing the dishing.

As described above, in the present embodiment, the hydrophilicity is provided to the surface of the low dielectric constant insulating film 3 by irradiating the electron beam. Thus, a difference in the polishing rate between the wiring material and the insulating film may be reduced. As a result, the dishing caused due to a difference in the polishing rate between the wiring material and the insulating film may be prevented. In this case, a dielectric constant may be lowered by polishing substantially completely the reformed layer 31, but the reformed layer 31 may be left slightly.

Also, a gradient is given to the concentration of the hydroxy group in the reformed layer 31, and the polishing rate is lowered gradually. Thus, a thickness of the low dielectric constant insulating film 3, i.e., a height of the conductive pattern 11, may be controlled with good precision. Also, the electron beam is employed in reforming the low dielectric constant insulating film 3. Thus, in contrast to the case where the plasma or the ultraviolet ray is employed in reforming the insulating film, a concentration gradient of the hydroxy group in the reformed layer 31 may be formed easily and a thickness of the reformed layer 31 may be controlled by using the electron beam.

Further, since the reformed layer 31 whose polishing is easy is provided, the polishing rate is set high at first and the polishing rate is lowered gradually later. Thus, an in-plane variation in the polishing may be improved, and a film peeling may be prevented.

Also, the semiconductor device manufactured in this manner may reduce a parasitic capacitance of the insulating film, and may implement the finer patterning of the wirings.

In the prior art, when the finer patterning of the wirings proceeds, a parasitic capacitance of the insulating film must be reduced further more. In this case, the cap film whose dielectric constant is high and which is left after the polishing causes an increase of the parasitic capacitance.

As the measure to this, a method of polishing directly the low dielectric constant insulating film by the low-pressure polishing without the cap film may be considered. However, in the low-pressure polishing, the polishing rate is low, a tact at a time of production is worsened, and an increase of cost caused due to an increase of the amount of the used polishing agent is caused. Further, even when the low-pressure polishing is employed, degradation of wettability to the slurry caused due to the hydrophobicity of the low dielectric constant insulating film could not be solved.

In contrast, in the semiconductor device manufacturing equipment and the method therefor, the surface of the organic insulating film is reformed by the electron beam, and wettability to the slurry may be improved. Thus, control of a polishing amount and control of uniformity in the polishing surface may be done with good precision not to employ the cap layer formed of the dielectric constant. Also, film peeling may be prevented by providing the reformed layer to the organic insulating film. As a result, the semiconductor device in which a parasitic capacitance of the insulating film may be reduced may be obtained.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a semiconductor device, comprising:
  forming an organic insulating film over a semiconductor substrate;
  irradiating an electron beam to a surface of the organic insulating film;
  forming recesses in the organic insulating film;
  forming a conductive material over the organic insulating film and in the recesses; and
  removing the conductive material over the organic insulating film by polishing to expose the surface of the organic insulating film and to leave the conductive material buried in the recesses of the organic insulating film.

2. The method of manufacturing a semiconductor device, according to claim 1, wherein a dielectric constant of the organic insulating film is 3.0 or less.

3. The method of manufacturing a semiconductor device, according to claim 1, wherein the organic insulating film is formed of material that comprises a methyl group.

4. The method of manufacturing a semiconductor device, according to claim 2, wherein at least a part of the methyl group of the organic insulating film is substituted with a hydroxy group by irradiating an electron beam.

5. The method of manufacturing a semiconductor device, according to claim 3, wherein the organic insulating film is formed by using a material that comprises is any one of methylsilane, dimethylsilane, trimethylsilane, tetramethylsilane, phenylsilane, methylphenylsilane, cyclohexylsilance, ethylsilance, diethylsilance, tetraethoxysilane, dimethyldiethoxysilane, dimethyldimethoxysilane, dimethylethoxysilane, methyldiethoxysilance, triethoxysilane, trimethylphenoxysilane, phenoxysilane, diethoxysilance, diacetoxymethylsilane, methyltriethoxysilane, di-tert-butylsilance, tert-butylsilance, 1,3,5,7-tetramethylcyclotetrasiloxane, octamethylcyclotetrasiloxane, hexamethylcyclotrisiloxane, hexamethyldisiloxane, 1,1,2,2-tetramethyldisiloxane, and octamethyltrisiloxane, or their combination.

6. The method of manufacturing a semiconductor device, according to claim 1, wherein a slurry employed in the polishing comprises abrasive grains that comprises at least one of fumed silica, cerium, alumina, and silicon carbide, a dispersing agent that comprises potassium hydroxide or ammonium, an oxidizing agent that comprises ammonium peroxodisulfate or hydrogen peroxide liquid, an anticorrosive that comprises benzotriazole (BTA), and a chelating agent that comprises citric acid or malic acid.

7. The method of manufacturing a semiconductor device, according to claim 4, wherein, as irradiating conditions of the electron beam, an acceleration voltage is 2 keV to 4 keV, a dose is 50 $\mu C/cm^2$ to 400 $\mu C/cm^2$, and a processing temperature is 200° C. to 500° C.

8. The method of manufacturing a semiconductor device, according to claim 1, wherein an insulating film for a mask is formed over the organic insulating film to which an electron beam is irradiated, then the recesses are formed by patterning the insulating film for the mask and etching the insulating film, and then the insulating film for the mask is removed by the polishing.

* * * * *